(12) United States Patent
Van Vooren

(10) Patent No.: US 6,215,669 B1
(45) Date of Patent: Apr. 10, 2001

(54) DISCRETE COMPONENT IN-MOLD MOUNTING

(75) Inventor: Gregory Van Vooren, Carthage, IL (US)

(73) Assignee: Methode Electronics, Inc., Chicago, IL (US)

( * ) Notice: Subject to any disclaimer, the term of this patent is extended or adjusted under 35 U.S.C. 154(b) by 0 days.

(21) Appl. No.: 09/248,132

(22) Filed: Feb. 10, 1999

(51) Int. Cl.[7] ................................................. H05K 07/02
(52) U.S. Cl. ........................ 361/768; 361/807; 439/500; 174/52.1; 174/260; 206/724
(58) Field of Search ........................... 361/768, 807, 361/804, 762; 206/719, 724; 439/83, 500; 174/52.1, 52.2, 260; 248/27.1

(56) References Cited

U.S. PATENT DOCUMENTS

| | | | |
|---|---|---|---|
| 4,881,639 | * | 11/1989 | Matsuoka et al. .................. 206/724 |
| 5,007,859 | * | 4/1991 | Sangregory et al. ................ 439/500 |
| 5,038,253 | * | 8/1991 | Repplinger et al. ................ 361/807 |
| 5,111,362 | * | 5/1992 | Flamm et al. ....................... 361/736 |
| 5,211,579 | * | 5/1993 | Seong et al ......................... 439/500 |
| 5,225,970 | * | 7/1993 | Palumbo ............................. 361/807 |
| 5,369,802 | * | 11/1994 | Murray ................................ 455/351 |
| 5,567,177 | * | 10/1996 | Foerstel et al. ..................... 439/526 |
| 5,727,688 | * | 3/1998 | Ishii et al. ........................... 206/724 |
| 5,922,489 | * | 7/1999 | Adachi ................................ 429/100 |

* cited by examiner

Primary Examiner—Jeffrey Gaffin
Assistant Examiner—David Foster
(74) Attorney, Agent, or Firm—Karl D. Kovach; David L. Newman

(57) ABSTRACT

A holder for holding a leadless circuit element includes opposing flanges which can be bent downwardly for bending the flanges into hands and fingers for holding the leadless circuit element within a plastic mold. In still further accord with the device, the device includes an insert displacement connection integral to a frame for allowing the leadless circuit element to be included in a circuit. Further, the assembly is insert molded in plastic.

12 Claims, 6 Drawing Sheets

DISCRETE COMPONENT IN-MOLD MOUNTING

TECHNICAL FIELD

The present invention relates to a holder for leadless circuit elements.

BACKGROUND

Electronic devices have an ever increasing need for compact assembly of discrete components. Some discrete components are mounted by means of leads soldered to a circuit pattern on a circuit board. Others are surface mounted directly onto the circuit pattern. There is a limitation on the density of surface mounted components because space must be left around the component for a gripping head which positions the components on the circuit pattern. "Leadless Electronic Component Carrier" at U.S. Pat. No. 4,727,456, by Mehta describes a means for increasing the density of electronic components. It shows a trough having multiple vertical recesses into each of which a component is dropped. The trough has vertically oriented conductive paths corresponding to each component in each recess of the trough. These conductive paths extend down to feet of the trough which are soldered to a circuit board.

The Mehta solution invites oxidation of the conductive paths between the time at which the conductor, typically metal, is placed on the recess and the time at which the leadless component is dropped into the recess. Moreover, the Mehta solution does not prevent oxidation of the conductive paths as they press against metal contacts on the ends of the leadless component. The result is an electrical contact which is altered with time and progressively poorer as time progresses and oxidation increases. For solving the problem of mounting components, there is desired a solution that provides for mounting of leadless components without oxidation in a quick and inexpensive manner.

SUMMARY OF THE INVENTION

It is an object of the present invention to mount a leadless component in plastic molding.

It is an object of the present invention to provide circuit element inserts which are reduced in volume because of the use of a circuit component without leads.

It is an object of the present invention to provide a circuit element which when inserted into a circuit is easily retained because it is insert molded.

It is an object of the present invention to provide a circuit element which once inserted into a circuit element is not removed by vibrations experienced in product testing or actual use because the circuit element is insert molded.

It is an object of the present invention to provide cheaper assembly of electronic products because product assembly does not include means to hold the leads of a circuit element.

It is an object of the present invention to provide improved electrical connection between a circuit element and its interfacing circuit elements by insert molding of circuit elements after it has been inserted into a circuit such that the connection is not continually exposed to chemicals which would oxidize conductive materials making the connection.

According to the present invention, a planar conductive frame, for insertion into a mold, includes opposing flanges which can be bent downwardly for bending the flanges into hands and fingers for holding a leadless circuit element within a plastic mold. The present invention further includes an insert displacement connection integral to said frame and disposed to one side of said arms and hands for allowing the leadless circuit element to be included in a circuit. In further accord with the present invention, the assembly is molded in plastic. The hands and fingers integral to the flange keep a leadless component stable as plastic is injected into the mold so that the component doesn't float away and out of position.

One advantage of the present invention over the prior art is that it reduces the opportunity for oxidation of metallic contacts holding a circuit element or the contacts on the ends of that element because the present invention includes plastic molded in around the circuit element.

A second advantage is that the present invention includes less metal than the prior art because only as much metal is included as is needed to accomplish the goal—mounting a circuit element.

A third advantage is that the invention uses a single structure in that the hands and fingers formed of the flange perform both the mechanical function of holding the leadless circuit element while providing a conductive path through the circuit element.

These and other objects, features and advantages will become more apparent in light of the following text and drawings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED WRITTEN DESCRIPTION OF THE PREFERRED EMBODIMENT

Figure 1:
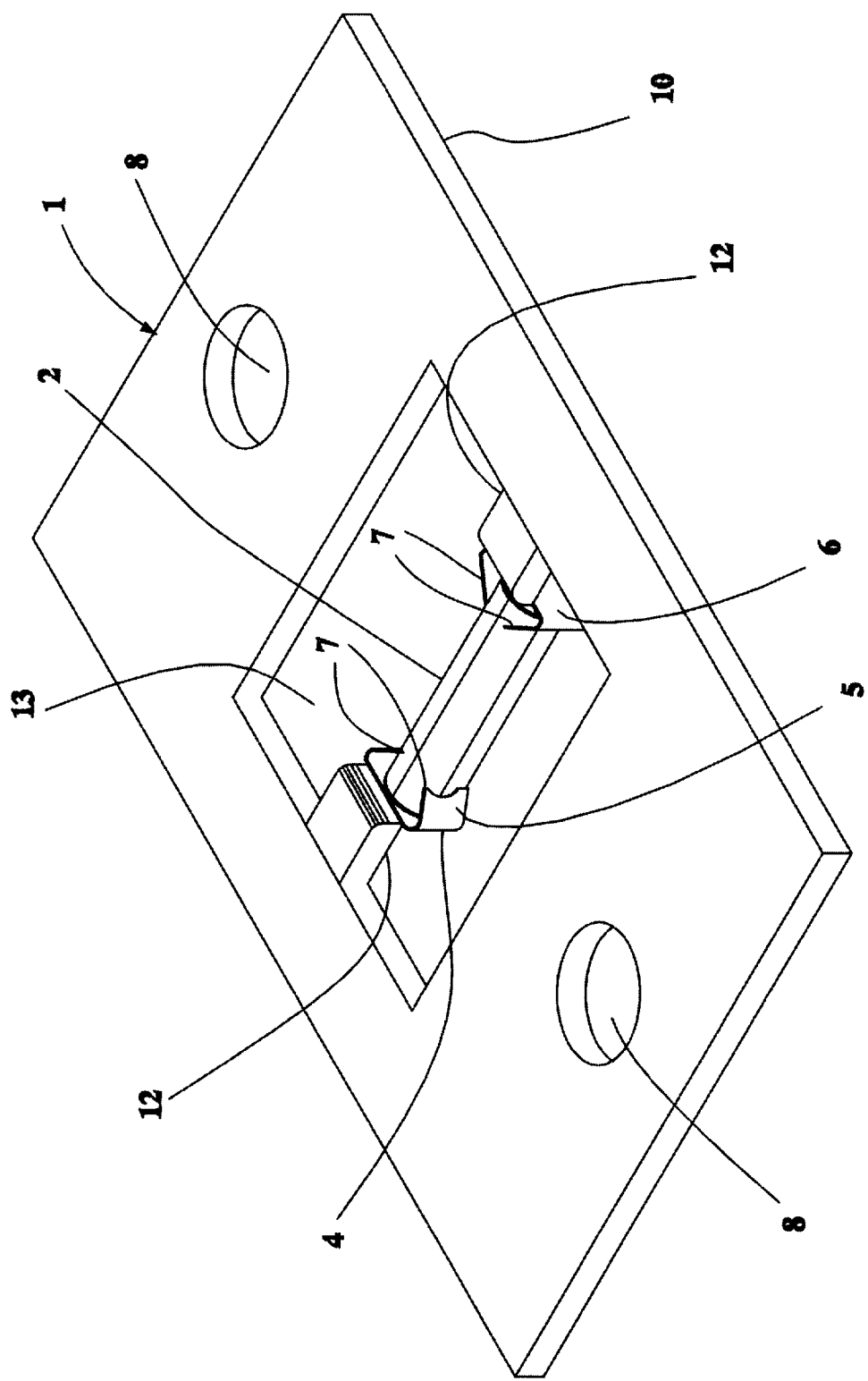
FIG. 1 is a perspective view of a leadless discrete component holder according to the present invention.

FIG. 1 shows a holder 1. The holder is conductive and may be formed of stamped conductive metal GPU electronic component 2 held by hands 4, 6 and grasped by elongated fingers 7 and stubby fingers 5. Each hand 4, 6 is a flange integral with a frame 10 and bent around the ends of leadless component 2. Each hand 4, 6 includes four fingers 5,5,7,7 including two stubby fingers 5 and two elongated fingers 7. In FIG. 1, the stubby fingers 5 wrap around leadless component 2 on a bottom side of leadless component 2 while elongated fingers 7 wrap around a top side of leadless component 2.

Leadless component 2 can be any of a number of circuit elements including a resistor, diode, inductor, battery, fuse, or capacitor. For example, leadless component 2 can include a leadless barrel resistor. Hands 4, 6 are held by arms 12 within an opening 13. Arms 12 extend from frame 10 into opening 13. Frame 10 includes locator holes 8, arms 12, hands 4, 6, fingers 5, 7 and frame 10 are all part of a single holder 1.

Figure 2:
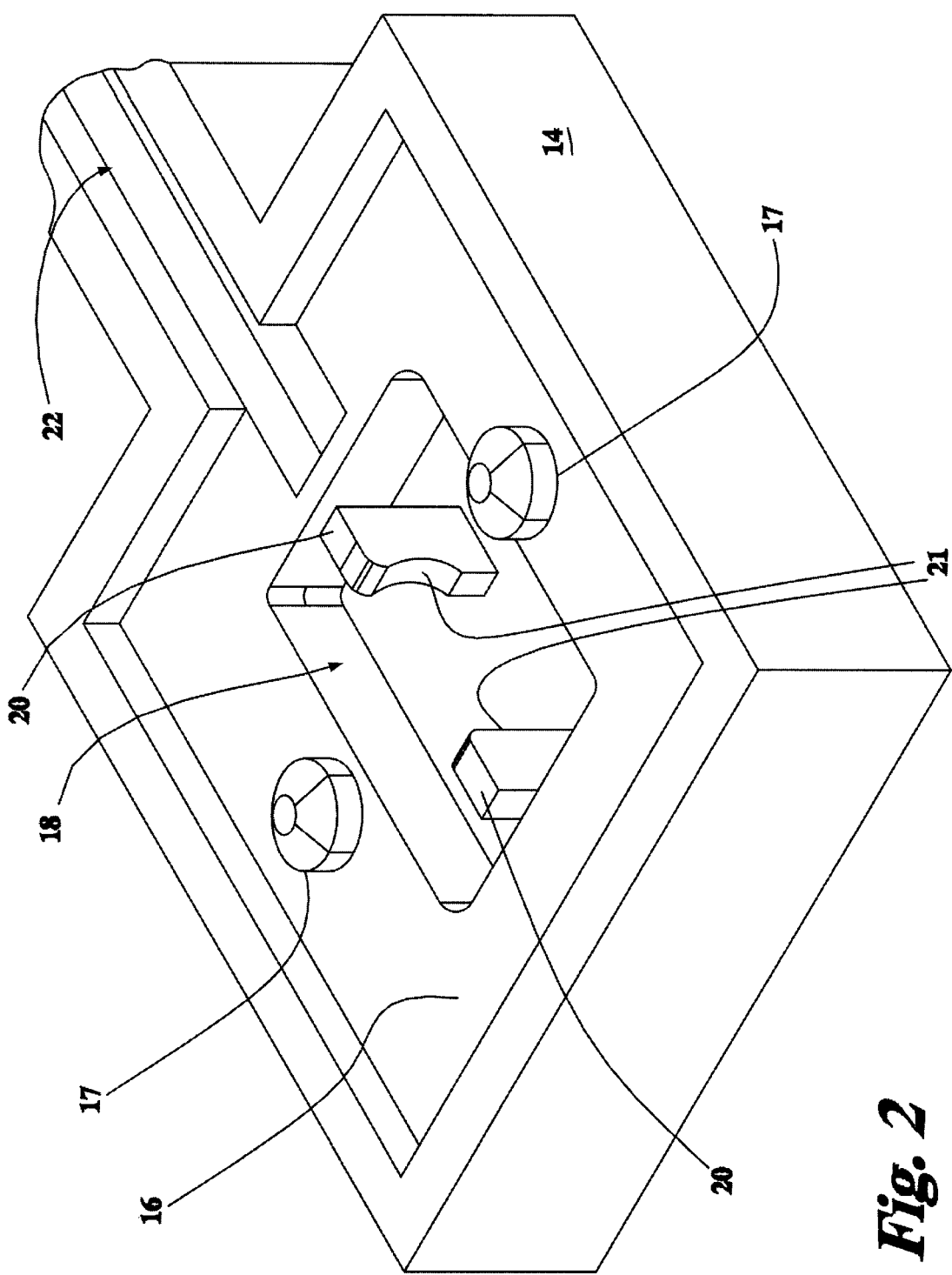
FIG. 2 is a perspective view of a mold for receiving the insert of FIG. 1.

FIG. 2 shows generally a mold half 14 having a receiving area 16 for receiving the circuit frame 10 of the holder 1 of FIG. 1. The locator holes 8 of frame 10 (FIG. 1) may be overlaid onto mounds 17. When this is done, leadless component 2 descends into cavity 18. Cavity 18 includes vertical columns 20 which buttress hands 4, 6 (FIG. 1) and, in turn, nestle leadless component 2 within cavity 18. One may consider the palm of hands 4, 6 as pressed against the ends of leadless component 2. The backs of those hands 4, 6 are pressed against surfaces 21 with the result that leadless component 2 is wedged into cavity 18 between columns 20. Bed 22 carries plastic molding material into the mold and upon curing will secure component 2 within plastic material.

Figure 3:
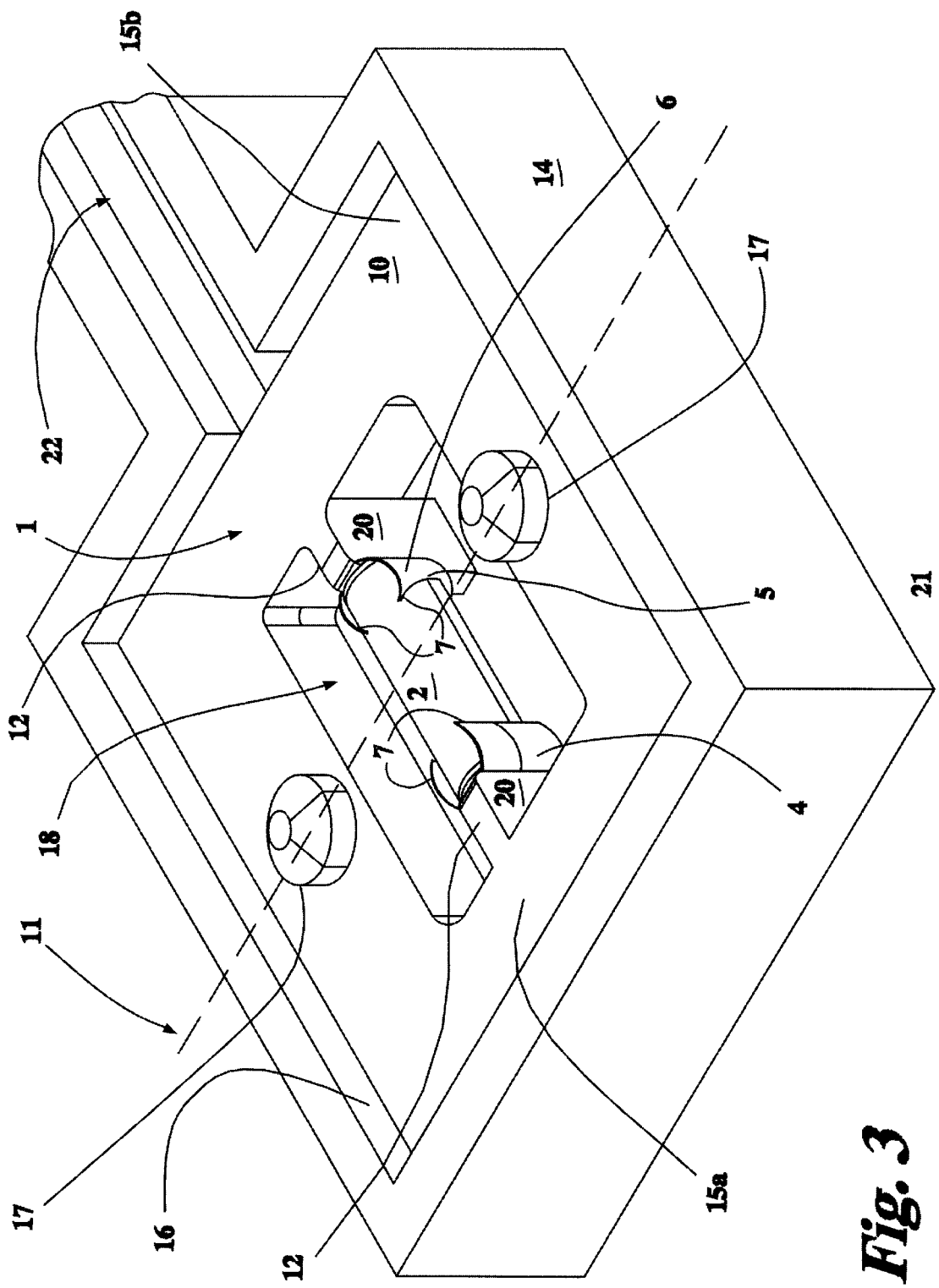
FIG. 3 is a perspective view of the insert of FIG. 1 sitting within the mold of FIG. 2.

FIG. 3 is a perspective view of the holder 1 of FIG. 1 sitting within the mold half 14 of FIG. 2. Frame 10 fills insert receiving area 16 shown in FIG. 2. Elongated and stubby fingers 5, 7 hold component 2 in hands 4, 6 using arms 12 which are buttressed by columns 20 in the cavity 18. After the holder 1 is placed in the mold half 14, the mold half 14 is placed in a press and the top half (not shown) of the mold is mated to the bottom half 14. The top half includes walls to enclose cavity 18 so that plastic is not injected into it. The top half also includes finger compressors so that upon closing the fingers are bent or reformed by the finger compressors in order to more securely hold component 2 between the fingers and insure electrical connectivity. Plastic can flow through bed 22 up to and around holder 1 and therefore leadless component 2. Plastic does not flow into cavity 18 because allowing this might diminish electrical conductivity through holder 1 and leadless component 2. Therefore, bed 22 is not continuous into cavity 18, as is shown in FIG. 2 there is a wall between the cavity 18 and the bed 22. In operation, frame 10 is cut along line 11 to separate frame end 15a from frame end 15b, so that a circuit can be made through leadless component 2. That is, the frame 10 becomes two pieces. However, the leadless component 2 is not broken. Without this, current would flow around and through frame 10 and avoid or bypass leadless component 2.

Figure 4:
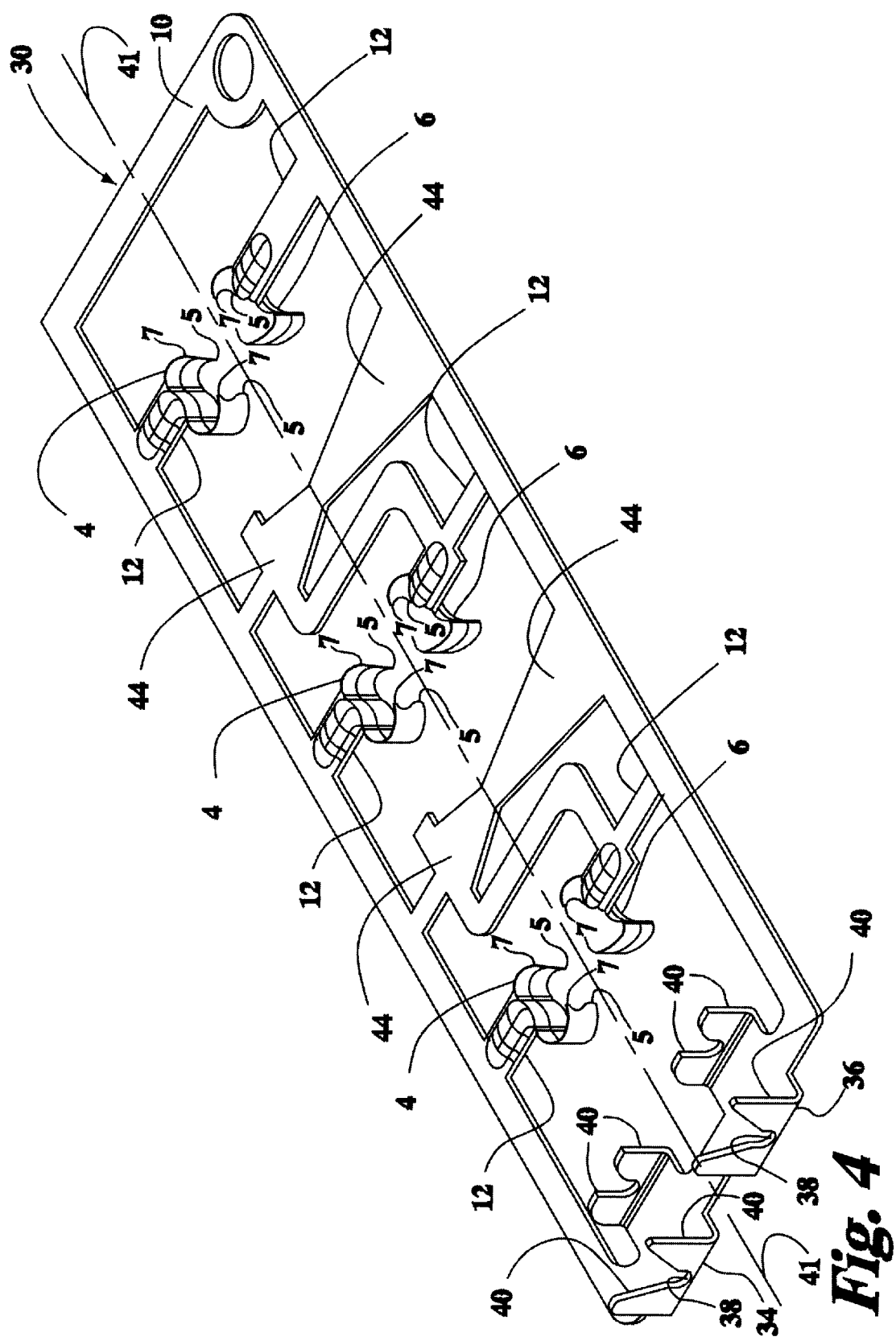
FIG. 4 is a perspective view of an insert for multiple discrete components as shown in FIGS. 1–3, with an insulation displacement contacts.

FIG. 4 is a perspective view of an alternative embodiment showing a metal cutout 30 for holding three circuit components 2 (not shown in FIG. 3) between fingers 5, 7 of hands 4, 6 attached to arms 12. Insulation displacement contacts 34, 36 allow insulating wires (not shown) to be sliced when pressed into grooves 38. Insulating wires are cut by the upstanding groove walls 40 when the wires are pressed down into the grooves 38. When the top half of the mold is closed onto the bottom half. Therefore, it is understood that a component may be manufactured according to the alternate embodiment having conductor wires exiting from the package for attachment to an electronic device. After the component 30 is removed from the mold, then breaks are made alone line 41 and the frame 10 is cut into two halves, thus forming cut halves, so as to electrically isolate the cut halves of frame 10 from each other. This is done so that the cut halves of frame 10 are electrically connectable only by means of insulated wires inserted into the insertion displacement connection grooves 38. In addition, tabs 44, as shown in FIG. 4, can be then bent to point in a common direction such as one perpendicular to the plane of frame 10. After The tabs 44 are integral to the frame 10 the break is made, tabs 44 are free to be used to be electrically connected to one another by any external means.

Figure 5:
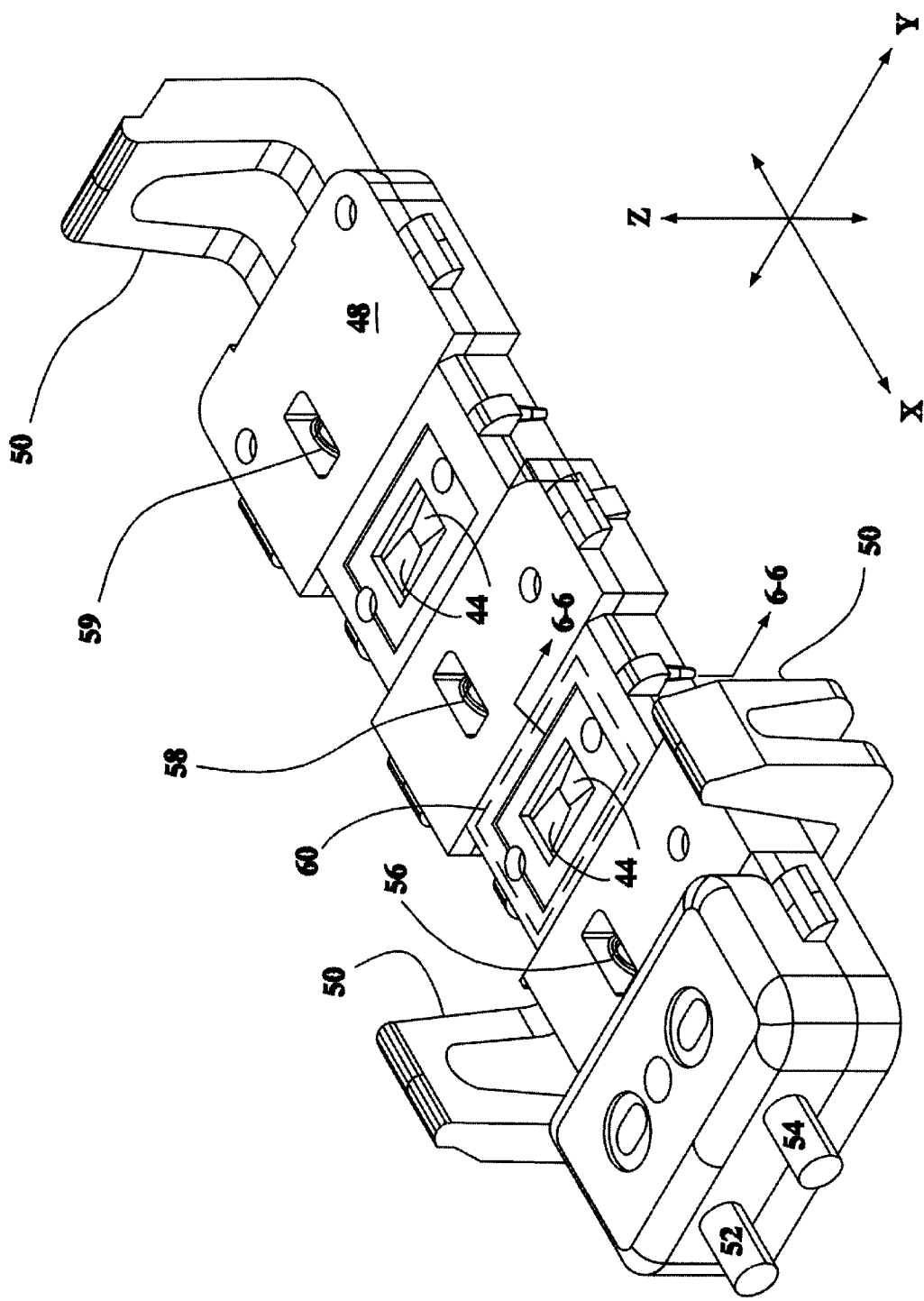
FIG. 5 is a perspective of the complete molded discrete component and holder.

FIG. 5 shows the assembly of FIG. 4 molded in plastic insulator 48 in the x-y plane. Plastic insulator 48 has plastic connectors 50 in the perpendicular to the x-y axis for snapping the plastic insulator 48 onto an assembly (not shown). Conductors 52, 54 lead into plastic insulator 48 for forming an electrical circuit with leadless components 56, 58, 59 which are contained in a frame substantially similar to that of FIG. 4. As shown, tabs 44 which were also shown in FIG. 4 are separated from one another and all four pointing in the z- direction in a common direction upwards from the x-y plane of the plastic mold 48. By causing the tabs 44 to be electrically shorted by a shorting bar 61 (FIG. 6) on an apparatus to which insulator 48 is mounted, one may short circuit a leadless component 56, 58, 59. For example, placing a shorting bar 61 across tabs 44 in region 60 would cause leadless components 58, 59 to be eliminated from the circuit supplied by current passing through leads 52, 54.

Figure 6:
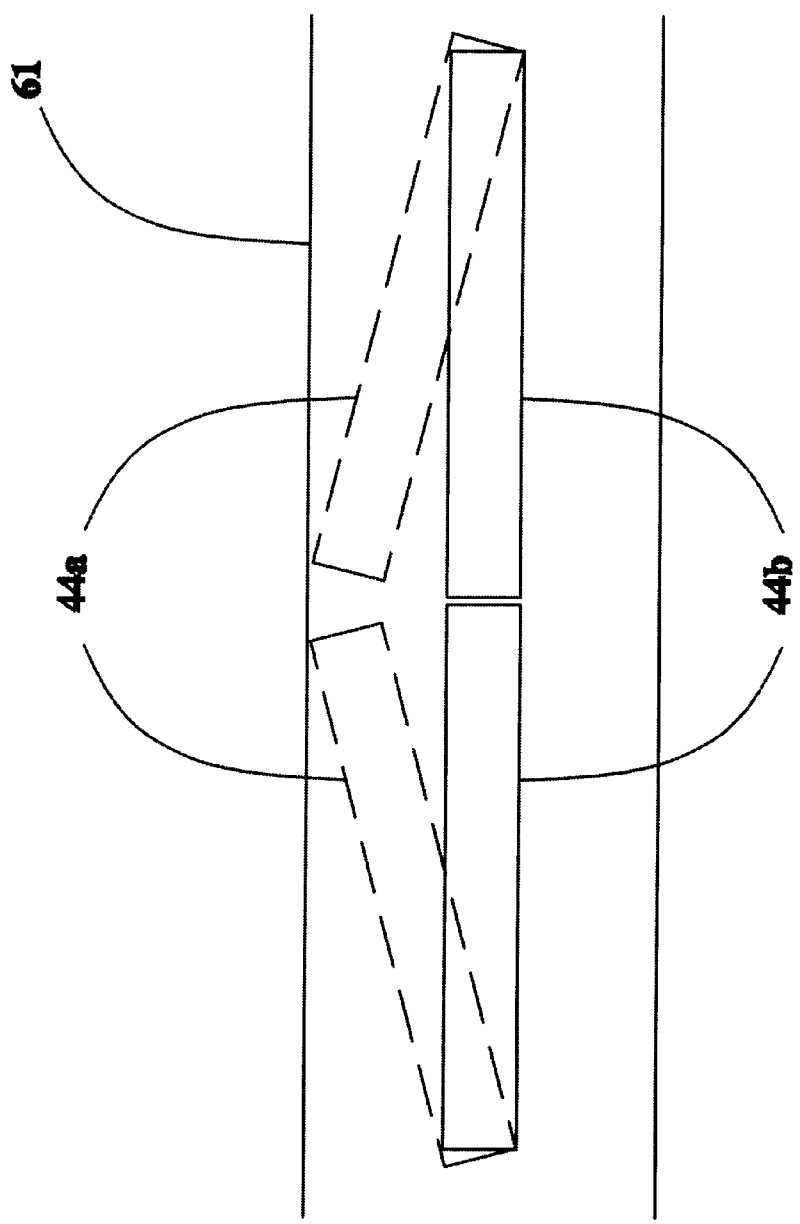
FIG. 6 is a side view taken at lines 6—6 of tabs 44 being electrically shorted by a shorting bar 61.

FIG. 6 shows tabs 44 being shorted by an exemplary shorting bar. It is understood by a person of ordinary skill in the art that the structure which shorting bar 61 is not so important as its function—shorting. In FIG. 6, tabs 44 are not in electrical contact when they are in the position a shown by the dotted lines, but as a shorting bar 61 is lowered tabs 44 come into electrical contact through shorting bar 61 as shown by the solid lines representing tabs 44 in electrical contact at postion b.

It should be understood that various changes and modifications to the presently preferred embodiments described herein will be apparent to those skilled in the art. Such changes and modifications may be made without departing from the spirit and scope of the present invention and without diminishing its attendant advantages.

What is claimed is:

1. An assembly for holding a leadless circuit element, comprising:

a conductive holder including a conductive planar frame;

wherein said conductive holder includes two conductive arms integral with said conductive planar frame and oriented at an angle with respect to the conductive planar frame, a first conductive arm of said two conductive arms being positioned on one side of said conductive planar frame and a second conductive arm of said two conductive arms being positioned on another side of said conductive planar frame which is opposite said first conductive arm;

conductive hands integral to said two conductive arms, a first conductive hand of the conductive hands associated with the first conductive arm and a second conductive hand of the conductive hands associated with the second conductive arm in opposed relationship with the first conductive hand for cupping and holding conductive ends of the leadless circuit element, an insertion displacement connection integral to said conductive planar frame for receiving insulated conductive wires inserted into insulation displacement connection grooves of the insertion displacement connection, wherein the insulation displacement connection grooves slice insulation on said insulated conductive wires thereby bringing the conductive portion of said insulated conductive wires into contact with said conductive planar frame;

said conductive hands and conductive planar frame being contained within molded plastic and electrically connected to said insulated conductive wires passing through said molded plastic for electrically connecting said conductive hands to a circuit external to said molded plastic; and the leadless circuit element contained within and electrically connected to said conductive hands.

2. The assembly of claim 1 wherein said assembly includes multiple pairs of opposed conductive hands extending from multiple pairs of opposed conductive arms each integral with said conductive planar frame.

3. The assembly of claim 2 wherein said leadless circuit element is a member of the group consisting of capacitors, diodes, resistors, batteries, and inductors.

4. The assembly of claim 1 wherein said angle is 90 degrees.

5. The assembly of claim 4 wherein said leadless circuit element is a member of the group consisting of capacitors, diodes, resistors, batteries, and inductors.

6. The assembly of claim 1 wherein said conductive planar frame includes a second conductive holder opposing the conductive holder so as to form opposed conductive holders and a pair of opposed flanges between said opposed conductive holders, said pair of flanges being electrically connectible for short circuiting a leadless circuit element held by one of said opposed conductive holders when a shorting bar is placed across said opposed flanges.

7. The assembly of claim 6 wherein said frame includes the shorting bar placed across said opposed flanges for shorting out of a circuit one of said opposed conductive holders.

8. The assembly of claim 7 wherein said leadless circuit element is a member of the group consisting of capacitors, diodes, resistors, batteries, and inductors.

9. The assembly of claim 6 wherein said leadless circuit element is a member of the group consisting of capacitors, diodes, resistors, batteries, and inductors.

10. The assembly of claim 1 wherein said leadless circuit element is a member of the group consisting of capacitors, diodes, resistors, batteries, and inductors.

11. A method of forming a connector assembly, including the steps of:

providing a planar conductive frame having a pair of flanges integral to said planar conductive frame and disposed on opposite sides of said planar conductive frame;

bending said flanges into arms extending from said planar conductive frame and hands integral with said arms and remote to said planar conductive frame, each hand for cupping one end of a leadless circuit element;

inserting said planar conductive frame and hands into a mold;

inserting the leadless circuit element into said hands such that conductive ends of said leadless circuit element touch said hands;

connecting conductive wires to insertion displacement connections integral with said planar conductive frame such that said hands are electrically connectible to a circuit through said conductive wires;

pouring plastic into said mold and around said planar conductive frame and leadless circuit element for providing a leadless component which is molded in plastic and electrically connected to said conductive wires.

12. The method of claim 11 wherein said leadless circuit element is a member of the group consisting of capacitors, diodes, resistors, batteries, and inductors.

* * * * *